United States Patent
Yamakawa et al.

(10) Patent No.: US 6,518,204 B2
(45) Date of Patent: Feb. 11, 2003

(54) CURABLE ORGANOPOLYSILOXANE COMPOSITION AND METHOD OF MANUFACTURING SEMICONDUCTOR DEVICES WITH THE USE OF THE AFOREMENTIONED COMPOSITION

(75) Inventors: Kimio Yamakawa, Chiba Prefecture (JP); Kazumi Nakayoshi, Chiba Prefecture (JP); Hiroki Ishikawa, Chiba Prefecture (JP); Ryoto Shima, Chiba Prefecture (JP); Junji Nakanishi, Chiba Prefecture (JP); Tomoko Kato, Chiba Prefecture (JP); Minoru Isshiki, Chiba Prefecture (JP); Katsutoshi Mine, Chiba Prefecture (JP)

(73) Assignee: Dow Corning Toray Silicone Company, Ltd., Tokyo (JP)

( * ) Notice: Subject to any disclaimer, the term of this patent is extended or adjusted under 35 U.S.C. 154(b) by 0 days.

(21) Appl. No.: 10/094,231

(22) Filed: Mar. 7, 2002

(65) Prior Publication Data

US 2002/0160624 A1 Oct. 31, 2002

(30) Foreign Application Priority Data

Mar. 9, 2001 (JP) .......................................... 2001-066786

(51) Int. Cl.$^7$ ...................... H01L 21/31; H01L 21/469; C08K 5/54; C08G 77/12
(52) U.S. Cl. ...................... 438/780; 438/778; 438/781; 524/261; 524/267; 528/31
(58) Field of Search ................................. 438/758, 778, 438/780, 781; 524/261, 267, 268; 528/31, 32

(56) References Cited

U.S. PATENT DOCUMENTS

| | | | | |
|---|---|---|---|---|
| 4,609,574 A | * | 9/1986 | Keryk et al. | 427/407.1 |
| 5,789,334 A | * | 8/1998 | Nakanishi et al. | 502/159 |
| 6,361,716 B1 | * | 3/2002 | Kleyer et al. | 252/514 |

FOREIGN PATENT DOCUMENTS

JP         58163652         9/1983

* cited by examiner

Primary Examiner—Alexander Ghyka
(74) Attorney, Agent, or Firm—Robert L. McKellar

(57) ABSTRACT

A curable organopolysiloxane composition comprises: (A) an organopolysiloxane with two or more silicon-bonded hydrogen atoms contained in one molecule in an amount not exceeding 0.05 wt. %; (B) an organopolysiloxane with two or more alkenyl groups in one molecule {alkenyl groups of this components are to be in an amount of 0.01 to 1 mole per 1 mole of a silicon-bonded hydrogen atoms contained in said component (A)}; and (C) a hydrosilylation-reaction metal catalyst (with content of metal atoms within the range of 0.01 to 1,000 ppm in terms of weight units). A method of manufacturing a semiconductor device comprises: applying onto the surface of a semiconductor device and curing, the aforementioned curable organopolysiloxane composition.

13 Claims, 1 Drawing Sheet

CURABLE ORGANOPOLYSILOXANE COMPOSITION AND METHOD OF MANUFACTURING SEMICONDUCTOR DEVICES WITH THE USE OF THE AFOREMENTIONED COMPOSITION

FIELD OF THE INVENTION

The present invention relates to a curable organopolysiloxane composition and a method of manufacturing a semiconductor device using the composition. More specifically, the invention relates to a curable organopolysiloxane composition for forming a cured body of non-uniform properties with hardness of the surface layer higher than the hardness of the internal material. The invention also relates to an efficient method of manufacturing a semiconductor device having improved reliability due to a non-uniform coating in which the surface layer has hardness higher than that of the internal material.

BACKGROUND OF THE INVENTION

It is known to coat surfaces of semiconductor devices with coating agents in the form of a curable organopolysiloxane composition containing at least two or more silicon-bonded hydrogen atoms in one molecule, an organopolysiloxane with two or more alkenyl groups in one molecule, and a hydrosilylation metal catalyst. Such use results from the fact that the aforementioned coating agent can be cured by quick heating with the formation of a cured body of uniform properties with excellent electrical characteristics.

However, the following contradiction has to be solved: to protect a semiconductor device from external stress, the coating layer should be hard, while to protect the semiconductor device from internal stress, the aforementioned coating should have low hardness. It is understood that these two requirements cannot be satisfied at the same time.

It has been proposed, in Japanese Laid-Open Patent Application (Kokai) Sho 58-163,652, to solve the above problems by coating a semiconductor device with a cured layer of non-uniform properties having the surface layer harder than the inner material. This is achieved by using a curable organopolysiloxane composition comprising at least an organopolysiloxane with two or more silicon-bonded hydrogen atoms in one molecule, an organopolysiloxane with two or more alkenyl groups in one molecule, and a hydrosilylation metal catalyst, coating the surface of a semiconductor device with at least one component of the aforementioned composition, diffusing the remaining components into the coating, and curing the composition. A disadvantage of the above method is that it is difficult to control hardness of the coating and that the process is complicated.

It is an object of the present invention to provide a curable organopolysiloxane composition for forming a cured body of non-uniform properties with hardness of the surface layer higher than the hardness of the internal material. It is another object to provide an efficient method of manufacturing a semiconductor device having improved reliability due to a non-uniform coating in which the surface layer has hardness higher than that of the internal material.

SUMMARY OF THE INVENTION

The above problems are solved by the present invention that provides a curable organopolysiloxane composition comprising at least the following components:

(A) an organopolysiloxane with two or more silicon-bonded hydrogen atoms contained in one molecule in an amount not exceeding 0.05 wt. %;

(B) an organopolysiloxane with two or more alkenyl groups in one molecule {alkenyl groups of this components are used in an amount of 0.01 to 1 mole per 1 mole of silicon-bonded hydrogen atoms contained in said component (A)}, and (C) a hydrosilylation-reaction metal catalyst (with a content of metal atoms within the range of 0.01 to 1,000 ppm in terms of weight units).

Furthermore, the method of the invention for manufacturing a semiconductor device is characterized by coating the surface of a semiconductor device with the aforementioned curable organopolysiloxane composition, and then curing the coating.

DETAILED DESCRIPTION OF THE INVENTION

Figure 1:
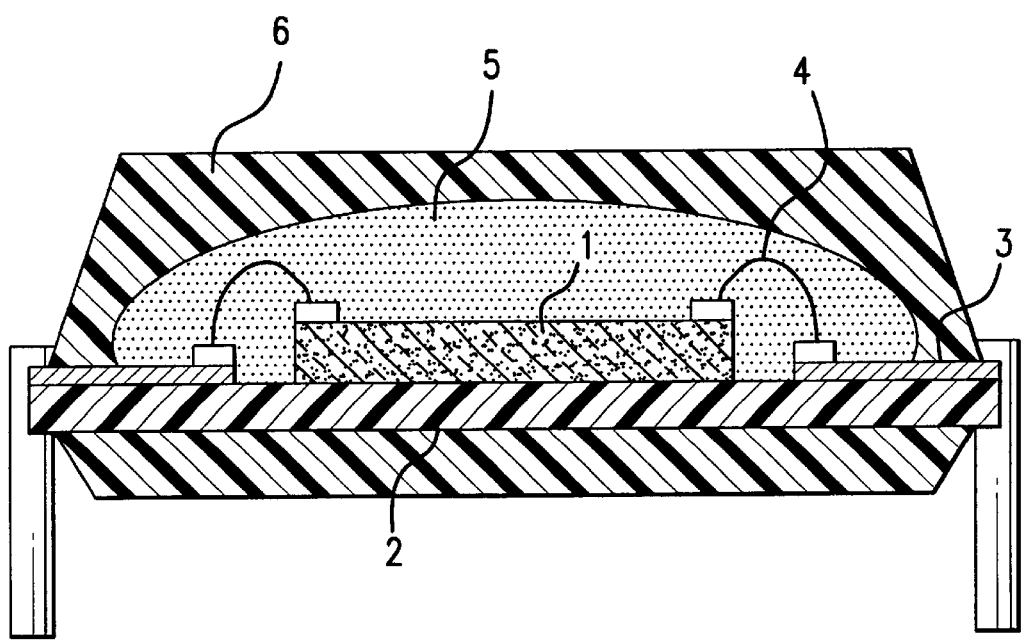
FIG. 1 is a sectional view of a hybrid IC shown as an example of a semiconductor device of the present invention.

The curable organopolysiloxane of the present invention will be now described in more detail. An organopolysiloxane (A), which is the main component of the composition of the present invention, is characterized by having two or more silicon-bonded hydrogen atoms contained in one molecule in an amount not exceeding 0.05 wt. %. If one molecule contains less than two silicon-bonded hydrogen atoms, the composition will not possess sufficient curability. Furthermore, if the amount of hydrogen atoms exceeds 0.05 wt. %, even though the composition could be efficiently cured, it would be impossible to obtain a cured body of a non-uniform structure with the hardness of the surface layer greater than that of the inner layer. Therefore, it is recommended that the hydrogen atoms are present in an amount not exceeding 0.03 wt. % and preferably do not exceed 0.02 wt. %.

Component (A) may have a linear or a partially linear branched structure, a branched structure, a cyclic structure, or a dendrite structure. The linear structure is preferable. In the molecule of component (A), silicon-bonded hydrogen atoms can be bonded, e.g., to molecular terminals and/or to the sides of the molecular chain. Bonding to the molecular terminals is preferable. In addition to hydrogen, the following groups can be bonded to silicon atoms in component (A): methyl, ethyl, propyl, butyl, pentyl, hexyl, heptyl, or similar alkyl groups; phenyl, tolyl, xylyl, naphthyl, or similar aryl groups; benzyl, phenethyl, or similar aralkyl groups; chloromethyl, 3-chloropropyl, 3,3,3-trifluoropropyl, or similar halogenated alkyl groups. Most preferable are methyl and phenyl groups.

There are no special limitations with regard to viscosity of component (A) at 25° C. It is recommended, however, to have this viscosity above 100 mPa·s, preferably within the range of 100 to 1,000,000, in particular between 100 and 50,000 mPa·s. If viscosity is below the recommended lower limit, it would be impossible to impart a sufficient mechanical strength to the cured layer. If, on the other hand, viscosity exceeds the recommended upper limit, the composition will not possess a required flowability.

Specific examples of the organopolysiloxane of component (A) include dimethylpolysiloxane having both molecular terminals capped with dimethylhydrogensiloxy groups, a copolymer of a methylhydrogensiloxane and a dimethylsiloxane having both molecular terminals capped with dimethylhydrogensiloxy groups, a copolymer of a methylhydrogensiloxane and a dimethylsiloxane having both molecular terminals capped with trimethylsiloxy groups, a copolymer of a methylphenylsiloxane and a dimethylsiloxane having both molecular terminals capped with dimethylhydrogensiloxy groups, a copolymer of a methyl (3,3,3-trifluoropropyl) siloxane and a dimethylsiloxane having both molecular terminals capped with dimethylhydrogensiloxy groups, a branched organopolysiloxane composed of siloxane units expressed by the formula $(CH_3)_2HSiO_{1/2}$, siloxane units expressed by the formula $(CH_3)_2SiO_{2/2}$, and siloxane units expressed by the formula $CH_3SiO_{3/2}$, as well as a branched organopolysiloxane composed of siloxane units expressed by the formula $(CH_3)_3SiO_{1/2}$, siloxane units expressed by the formula $(CH_3)HSiO_{2/2}$, and siloxane units expressed by the formula $CH_3SiO_{3/2}$. Most preferable among these are dimethylpolysiloxane having both molecular terminals capped with dimethylhydrogensiloxy groups, a copolymer of a methylphenylsiloxane and a dimethylsiloxane having both molecular terminals capped with dimethylhydrogensiloxy groups, a copolymer of a methyl (3,3,3-trifluoropropyl) siloxane and a dimethylsiloxane having both molecular terminals capped with dimethylhydrogensiloxy groups, or similar organopolysiloxanes having both molecular terminals capped with silicon-bonded hydrogen atoms.

The organopolysiloxane of component (B) is a curing agent for the composition of the invention. This component is characterized by containing two or more alkenyl groups in one molecule. Structurally, component (B) may have a linear, a partially-branched linear structure, a branch structure, or a dendrite structure. Alkenyl groups of the component (B) may comprise vinyl, allyl, butenyl, pentenyl, and hexenyl groups. Most preferable among these are vinyl groups. The alkenyl groups can be bonded, e.g., to molecular terminals and/or to the sides of the molecular chains. Although there are no special limitations with regard to the amount of the alkenyl groups in component (B), it is recommended that they be used in an amount of 0.01 to 30 wt. % based on the weight of component (B).

In addition to the alkenyl groups, the following groups can be bonded to silicon atoms in component (B): methyl, ethyl, propyl, butyl, pentyl, hexyl, heptyl, or similar alkyl groups; phenyl, tolyl, xylyl, naphthyl, or similar aryl groups; benzyl, phenethyl, or similar aralkyl groups; chloromethyl, 3-chloropropyl, 3,3,3-trifluoropropyl, or similar halogenated alkyl groups. Among these, most preferable are methyl and phenyl groups. Although there are no special restrictions with regard to viscosity of component (B) at 25° C., it is recommended that viscosity be within the range of 10 to 100,000 mPa·s, preferably between 10 and 50,000 mPa·s. If viscosity is below the recommended lower limit, it would be impossible to impart a sufficient mechanical strength to the cured body. If viscosity exceeds the recommended upper limit, the composition will not possess a required flowability.

The organopolysiloxane of the component (B) can be represented by the following specific compounds: dimethylpolysiloxane having both molecular terminals capped with dimethylvinylsiloxy groups, a copolymer of a methylvinylsiloxane and a dimethylsiloxane having both molecular terminals capped with dimethylvinylsiloxy groups, a copolymer of a methylvinylsiloxane and a dimethylsiloxane having both molecular terminals capped with trimethylsiloxy groups, a copolymer of a methylphenylsiloxane and a dimethylsiloxane having both molecular terminals capped with dimethylvinylsiloxy groups, a copolymer of a methyl (3,3,3-trifluoropropyl) siloxane and a dimethylsiloxane having both molecular terminals capped with dimethylvinylsiloxy groups, a branched organopolysiloxane composed of siloxane units expressed by the $(CH_3)_2(CH_2=CH)SiO_{1/2}$ formula, siloxane units expressed by $(CH_3)_2SiO_{2/2}$ formula, and siloxane units expressed by $CH_3SiO_{3/2}$ formula, as well as a branched organopolysiloxane composed of siloxane units expressed by the $(CH_3)_3SiO_{1/2}$ formula, siloxane units expressed by $(CH_3)(CH_2=CH)SiO_{2/2}$ formula, and siloxane units expressed by $CH_3SiO_{3/2}$ formula. Most preferable among these are a copolymer of a methylvinylsiloxane and a dimethylsiloxane having both molecular terminals capped with dimethylvinylsiloxy groups, a copolymer of a methylvinylsiloxane and a dimethylsiloxane having both molecular terminals capped with trimethylsiloxy groups, a methylvinylpolysiloxane having both molecular terminals capped with trimethylsiloxy groups, or similar organopolysiloxanes having alkenyl groups in side molecular chains.

The amount of component (B) in the composition should be such that the amount of alkenyl groups contained in component (B) is within the range of 0.01 to 1 mole, preferably 0.05 to 0.5 moles, per 1 mole of a silicon-bonded hydrogen atoms, in component (A). Although there are no special limitations with regard to the amount of component (B) needed for use in the composition of the invention, the aforementioned range is recommend because below the lower limit of this range the cured body will become insufficiently cured and above this range it would be difficult to produce the surface layer with hardness exceeding that of the inner layer material.

Component (C), which is a metal-type catalyst for hydrosilylation reaction, is used to accelerate curing. Component (C) may be a platinum catalyst, rhodium catalyst, or a palladium catalyst. Most preferable of these is a platinum catalyst. The platinum catalyst may be in the form of a platinum fine powder, platinum black, fine-powdered platinum on silica carrier, platinum on activated-carbon carrier, chloroplatinic acid, an alcoholic solution of a chloroplatinic acid, a platinum-olefin complex, a complex of platinum and an alkenylsiloxane, or a complex of platinum and a carbonyl compound.

In the composition of the present invention, component (C) should be used in such an amount that, in terms of weight units, metal atoms of this component are within the range of 0.01 to 1,000 ppm. This is because, if component (C) is used in an amount below the lower limit of the recommended range, the obtained composition cannot be quickly cured, and if the amount of the catalyst exceeds the upper limit of the recommended range, curing cannot be accelerated any more, and the cost of the product will increase.

To improve mechanical strength of a cured layer, the composition of the invention can be combined with a precipitated silica, fumed silica, baked silica, titanium oxide, alumina, glass, quartz, alumosilicic acid, iron oxide, zinc oxide, calcium carbonate, carbon black, or a similar filler, or with a hydrophobically surface-treated filler having the surface treated with an organohalosilane, organoalkoxysilane, organodisilazane, or with a similar organosilicon compound. There are no special limitations with regard to the amount of a filler for use in the composition of the invention. It is recommended, however, that the filler be used in an amount of 1 to 100 parts by weight based on 100 parts by weight of component (A).

To adjust the speed of curing, the composition of the invention can be combined with a reaction inhibitor, such as:

3-methyl-1-butyn-3-ol, 3,5-dimethyl-1-hexyn-3-ol, 3-phenyl-1-butyn-3-ol or a similar alkyne alcohol; 3-methyl-3-penten-1-yne, or a similar enyne compound; 1,3,5,7-tetramethyl-1,3,5,7-tetravinyl cyclotetrasiloxane, 1,3,5,7-tetramethyl-1,3,5,7-tetrahexenyl cyclotetrasiloxane, benzotriazol, etc. Although there are no special limitations with regard to the amount of the reaction inhibitor for use with the composition of the invention, it is recommended that the reaction inhibitor be used in an amount of 0.0001 to 5 parts by weight based on 100 parts by weight of the component (A).

In addition to the aforementioned components, the composition of the present invention can be combined with the following arbitrary components: methyltrimethoxysilane, vinyltrimethoxysilane, 3-glycidoxypropyltrimethoxysilane, 3-methacryloxypropyltrimethoxysilane, a siloxane oligomer that contains silicon-bonded hydrogen and glycidoxypropyl groups, a siloxane oligomer that contains silicon-bonded hydrogen and methacryloxypropyl groups, a siloxane oligomer that contains silicon-bonded hydrogen, glycidoxypropyl groups, and silicon-bonded alkoxy groups, a siloxane oligomer that contains silicon-bonded alkenyl groups and glycidoxypropyl groups, a siloxane oligomer that contains silicon-bonded alkenyl groups, glycidoxypropyl groups, and silicon-bonded alkoxy groups, or similar adhesion improvers; silicone resin, fluororesin, or a similar organic resin powder; silver, copper, or a similar conductive powder; as well as dyes, pigments, flame retarders, and solvents.

The composition of the present invention can be cured at room temperature or by heating for acceleration of the curing process. Heating should be carried out at a temperature from 50 to 200° C., preferably from 80 to 180° C.

When the composition of the invention is cured, it produces a cured body with hardness on the surface greater than in the inner material of the cured body. Therefore this composition is suitable for use in the electronic industry and in electrical engineering as an adhesive agent, potting agent, or a coating agent. The composition of the invention is especially advantageous for use as a coating agent for semiconductor elements. The coating agent for semiconductor elements prepared from the composition of the present invention is quickly cured by heating and forms a coating layer of a non-uniform structure with the surface layer harder than the inner material of the coating. Therefore the cured layer efficiently protects semiconductor elements from external stress, as well as from the internal stress.

The method of the present invention for manufacturing a semiconductor element will now be described in more detail.

The method includes applying the aforementioned curable organopolysiloxane composition onto the surface of a semiconductor element and then curing the composition. The semiconductor device may comprise a diode, transistor, thyrister, monolithic IC, as well as semiconductor elements used in hybrid ICs. The curable organopolysiloxane composition applied onto the surface of a semiconductor element is the one described above, which, when cured, produces a cured body of non-uniform structure with the surface layer having hardness greater than hardness of the inner material. The method of the invention is suitable for the production of the following semiconductor devices: diodes, transistors, thyristers, monolithic ICs, hybrid ICs, LSI, and VLSI.

FIG. 1 is a cross-sectional view of a hybrid IC as an example of a semiconductor device produced by the method of the present invention. The illustrated semiconductor device comprises a semiconductor element 1 placed onto a circuit board 2. The semiconductor element 1 is electrically connected via a bonding wire 4 to a circuit conductor element 3 linked to an external lead wire. In a cured body 5 formed from the curable composition of the present invention, the surface layer 5 serves as a coating layer for the semiconductor element 1. The coating layer 5 that coats the semiconductor element 1, in turn, is covered with a sealing resin layer 6. The circuit board can be made from fiber-glass reinforced epoxy resin, Bakelite resin, phenol resin, or a similar organic resin; alumina or similar ceramics; copper, aluminum, or a similar metal. The circuit conductor element 3 can be made from copper, or a copper-palladium [alloy]. The bonding wire 4 can be made from gold, copper, or aluminum. Apart from the semiconductor element 1, the circuit board 2 may contain resistors, capacitors, coils, or similar elements of electronic circuits. Examples of sealing resin 6 are epoxy resin, phenol resin, polyphenylene sulfide resin, or the like.

The method of the invention is carried out by placing the semiconductor element 1 onto the circuit board 2, electrically connecting the semiconductor element 1 with the circuit conductor element by means of the bonding wire 4, and applying the aforementioned curable organopolysiloxane composition onto the surface of the semiconductor element 1. The composition applied onto the semiconductor element 1 is cured, e.g., by retaining it at room temperature, or by heating it at a temperature from 50 to 200° C. If necessary, the semiconductor element 1 coated with the cured body 5 can be sealed with a layer of the sealing resin 6.

EXAMPLES

The curable organopolysiloxane composition and method of the invention for the production of semiconductor devices with the use of the aforementioned composition will now be described in more detail with reference to practical examples. All values of viscosity were measured at 25° C. Condition of the cured bodies and reliability of semiconductor devices were evaluated by the methods described below.

Reference Example 1
Evaluation of the Condition of Cured Bodies 10 g of the curable organopolysiloxane composition were applied by means of a dispenser onto a 0.3 mm-thick 5 cm×5 cm aluminum plate, and directly after the application the applied layer was cured for 1 hour at 150° C. in a hot-air circulation oven. The cured body was cut in the middle, and the cut surface was observed under a 10× stereomicroscope. Hardness of the surface layer was compared with the hardness of the inner layer by pressing on each layer with a metal knife.

Reference Example 2
Evaluation of Reliability of Semiconductor Devices—Method (1)

A semiconductor device of the type shown in FIG. 1 was produced. The semiconductor device contained an element 1, which was placed onto a circuit board 2 made from fiber-glass reinforced epoxy-resin and contained a circuit conductor element 3 printed on the surface of the board and a bonding wire 4 that electrically connected the semiconductor element 1 to the circuit conductor element 3. Directly after application of the curable organopolysiloxane composition onto the surface of the semiconductor element 1 by means of a dispenser, the coated objects were cured by heating for 1 hour at 150° C. in a hot-air circulation oven, whereby twenty semiconductor devices were produced. Prior to sealing with the sealing resin 6, the semiconductor devices were subjected to a dropping test by dropping them onto a concrete floor from a height of 1 m and with support surfaces facing down. Conditions of the devices were evaluated by checking electrical conductivity through the devices between external lead wires and by determining a number (percentage) of non-conductive devices.

Reference Example 3
Evaluation of Reliability of Semiconductor Devices—Method (2)

A semiconductor device of the type shown in FIG. 1 was produced. The semiconductor device contained an element 1 which was placed onto a circuit board 2 made from fiberglass reinforced epoxy-resin and contains a circuit conductor element 3 printed on the surface of the board and a bonding wire 4 that electrically connected the semiconductor element 1 to the circuit conductor element 3. Directly after application of the curable organopolysiloxane composition onto the surface of the semiconductor element 1 by means of a dispenser, the coated objects were cured by heating for 1 hour at 150° C. in a hot-air circulation oven, and then coated again with the sealing resin 6, whereby twenty semiconductor devices were produced. The obtained devices were subjected to thermal cycle testing with 1000 thermal cycles, each cycle consisting of 30 min. cooling at −65° C. and 30 min. heating at +150° C. Conditions of the devices were then evaluated by checking electrical conductivity through the devices between external lead wires and by determining a number (percentage) of non-conductive devices.

Practical Example 1

A curable organopolysiloxane composition having viscosity of 12,000 mPa·s was prepared by uniformly mixing the following components: 100 parts by weight of a 2000 mPa·s viscosity dimethylpolysiloxane having both molecular terminals capped with dimethylhydrogensiloxy groups (the contents of silicon-bonded hydrogen was 0.0054 wt. %); 2.6 parts by weight of a 400 mPa·s viscosity copolymer of a methylvinylsiloxane (with 0.68 wt. % contents of vinyl groups) and a dimethylsiloxane having both molecular terminals capped with dimethylvinylsiloxy groups (this copolymer contained 0.12 mole of vinyl groups based on 1 mole of silicon-bonded hydrogen in the aforementioned dimethylpolysiloxane); a complex of platinum and 1,3-divinyltetramethyldisiloxane (with 5 ppm of metallic platinum in the complex, in terms of weight units); 7 parts by weight of fumed silica having surface hydrophobically treated to BET specific surface area of 200 m$^2$/g with hexamethyldisilazane; and 0.01 parts by weight of 3-phenyl-1-butyn-3-ol. The obtained curable organopolysiloxane composition was evaluated in a cured state and with regard to reliability of semiconductor devices prepared with the use of this composition. The results of the evaluation are given in Table 1.

Practical Example 2

A curable organopolysiloxane composition having viscosity of 9,500 mPa·s was prepared by uniformly mixing the following components: 100 parts by weight of a 500 mPa·s viscosity dimethylpolysiloxane having both molecular terminals capped with dimethylhydrogensiloxy groups (the contents of silicon-bonded hydrogen was 0.013 wt. %); 5.2 parts by weight of a 400 mPa·s viscosity copolymer of a methylvinylsiloxane (with 0.68 wt. % contents of vinyl groups) and a dimethylsiloxane having both molecular terminals capped with dimethylvinylsiloxy groups (this copolymer contained 0.10 moles of vinyl groups based on 1 mole of silicon-bonded hydrogen in the aforementioned dimethylpolysiloxane); a complex of platinum and 1,3-divinyltetramethyldisiloxane (with 5 ppm of metallic platinum in the complex, in terms of weight units); 9 parts by weight of fumed silica having surface hydrophobically treated to BET specific surface area of 200 m$^2$/g with hexamethyldisilazane; and 0.01 parts by weight of 3-phenyl-1-butyn-3-ol. The obtained curable organopolysiloxane composition was evaluated in a cured state and with regard to reliability of semiconductor devices prepared with the use of this composition. The results of the evaluation are given in Table 1.

Comparative Example 1

A curable organopolysiloxane composition having viscosity of 12,000 mPa·s was prepared by uniformly mixing the following components: 100 parts by weight of a 2000 mPa·s viscosity dimethylpolysiloxane having both molecular terminals capped with dimethylvinylsiloxy groups (the contents of vinyl groups was 0.24 wt. %); 2.6 parts by weight of a 20 mPa·s viscosity copolymer of a methylhydrogensiloxane (with 0.75 wt. % contents of silicon-bonded hydrogen) and a dimethylsiloxane having both molecular terminals capped with trimethylsiloxy groups (the aforementioned dimethylpolysiloxane contained 0.46 moles of vinyl groups based on 1 mole of silicon-bonded hydrogen in the aforementioned copolymer); a complex of platinum and 1,3-divinyltetramethyldisiloxane (with 5 ppm of metallic platinum in the complex, in terms of weight units); 7 parts by weight of fumed silica having surface hydrophobically treated to BET specific surface area of 200 m$^2$/g with hexamethyldisilazane; and 0.01 parts by weight of 3-phenyl-1-butyn-3-ol. The obtained curable organopolysiloxane composition was evaluated in a cured state and with regard to reliability of semiconductor devices prepared with the use of this composition. The results of the evaluation are given in Table 1.

Comparative Example 2

A curable organopolysiloxane composition having viscosity of 13,000 mPa·s was prepared by uniformly mixing the following components: 100 parts by weight of a 2000 mPa·s viscosity dimethylpolysiloxane having both molecular terminals capped with dimethylvinylsiloxy groups (the contents of vinyl groups was 0.24 wt. %); 0.59 parts by weight of a 20 mPa·s viscosity copolymer of a methylhydrogensiloxane (with 0.75 wt. % contents of silicon-bonded hydrogen) and a dimethylsiloxane having both molecular terminals capped with trimethylsiloxy groups (the aforementioned dimethylpolysiloxane contained 2.0 moles of vinyl groups per 1 mole of silicon-bonded hydrogen in the aforementioned copolymer); a complex of platinum and 1,3-divinyltetramethyldisiloxane (with 5 ppm of metallic platinum in the complex, in terms of weight units); 7 parts by weight of fumed silica having surface hydrophobically treated to BET specific surface area of 200 m$^2$/g with hexamethyldisilazane; and 0.01 parts by weight of 3-phenyl-1-butyn-3-ol. The obtained curable organopolysiloxane composition was evaluated in a cured state and with regard to reliability of semiconductor devices prepared with the use of this composition. The results of the evaluation are given in Table 1.

TABLE 1

| Properties | | Practical Examples | | Comparative Examples | |
|---|---|---|---|---|---|
| | | Pr. Ex. 1 | Pr. Ex. 2 | Comp. Ex. 1 | Comp. Ex. 2 |
| Condition of Cured Body | | Non-uniform structure with surface layer hardness greater than inner material | Non-uniform structure with surface layer hardness greater than inner material | Uniform structure with surface and inner layers both equally hard | Uniform structure with surface and inner layers both equally soft |
| Reliability of Semiconductor Device | Criteria of non-suitability by Method (1) (%) | 0 | 0 | 0 | 40 |
| | Criteria of non-suitability by Method (2) (%) | 0 | 0 | 10 | 0 |

The curable organopolysiloxane composition of the present invention is characterized by forming a cured body of non-uniform structure with hardness of the surface layer greater than hardness of the inner material. Furthermore, a method of the invention can produce semiconductor devices having improved reliability by coating semiconductor elements with the cured layer of non-uniform structure having the surface layer with hardness exceeding hardness of the inner material.

We claim:

1. A composition comprising:
   (A) an organopolysiloxane with two or more silicon-bonded hydrogen atoms contained in one molecule, where the silicon-bonded hydrogen atoms are present in an amount not exceeding 0.05 wt. % based on weight of component (A);
   (B) an organopolysiloxane with two or more alkenyl groups in one molecule, where component (B) is present in an amount such that the alkenyl groups are contained in an amount of 0.01 to 1 mole per 1 mole of silicon-bonded hydrogen atoms in component (A); and
   (C) a hydrosilylation-reaction metal catalyst with a content of metal atoms of 0.01 to 1,000 ppm in terms of weight units.

2. The composition of claim 1, wherein in component (A), said silicon-bonded hydrogen atoms are contained in an amount not exceeding 0.03 wt. %.

3. The composition of claim 1, wherein in component (A), said silicon-bonded hydrogen atoms are contained in an amount not exceeding 0.02 wt. %.

4. The composition of claim 1, further comprising a filler.

5. The composition of claim 1, further comprising a filler comprising a precipitated silica, fumed silica, baked silica, titanium oxide, alumina, glass, quartz, alumosilicic acid, iron oxide, zinc oxide, calcium carbonate, or carbon black.

6. The composition of claim 4, wherein the filler is hydrophobically surface-treated.

7. The composition of claim 4, wherein the filler is hydrophobically surface-treated with an organosilicon compound.

8. The composition of claim 1, further comprising a reaction inhibitor.

9. The composition of claim 1, further comprising a reaction inhibitor comprising 3-methyl-1-butyn-3-ol, 3,5-dimethyl-1-hexyn-3-ol, 3-phenyl-1-butyn-3-ol or a similar alkyne alcohol; 3-methyl-3-penten-1-yne, or a similar enyne compound; 1,3,5,7-tetramethyl-1,3,5,7-tetravinyl cyclotetrasiloxane, 1,3,5,7-tetramethyl-1,3,5,7-tetrahexenyl cyclotetrasiloxane, or benzotriazol.

10. The composition of claim 1, further comprising an adhesion improver, a conductive powder, dyes, pigments, flame retarders, or solvents.

11. A method of manufacturing a semiconductor device comprising:
   i) applying the composition of claim 1 onto a surface of the semiconductor device, and
   ii) curing the composition.

12. A method of manufacturing a semiconductor device comprising:
   i) applying the composition of claim 2 onto a surface of the semiconductor device, and
   ii) curing the composition.

13. A method of manufacturing a semiconductor device comprising:
   i) applying the composition of claim 3 onto a surface of the semiconductor device, and
   ii) curing the composition.

* * * * *